United States Patent [19]
Klocek

[11] Patent Number: 5,240,670
[45] Date of Patent: Aug. 31, 1993

[54] METHOD OF IMPROVING THE MECHANICAL PROPERTIES OF SEMICONDUCTOR MATERIALS

[75] Inventor: Paul Klocek, Garland, Tex.

[73] Assignee: Texas Instruments Incorporated, Dallas, Tex.

[21] Appl. No.: 748,711

[22] Filed: Aug. 22, 1991

[51] Int. Cl.$^5$ .............................................. B29D 11/00
[52] U.S. Cl. ...................................... 264/322; 264/1.2
[58] Field of Search ......................... 264/1.2, 320, 322

[56] References Cited

U.S. PATENT DOCUMENTS

| | | | |
|---|---|---|---|
| 3,794,704 | 2/1974 | Strong | 264/1.2 |
| 4,118,448 | 10/1978 | Anderson | 264/1.2 |
| 4,171,400 | 10/1979 | Rosette et al. | 264/1.2 |
| 4,347,210 | 8/1982 | Maguire et al. | 264/1.2 |
| 4,410,468 | 10/1983 | Packer | 264/1.2 |

*Primary Examiner*—Jan H. Silbaugh
*Assistant Examiner*—Christopher A. Fiorilla
*Attorney, Agent, or Firm*—Rene E. Grossman; Richard L. Donaldson

[57] ABSTRACT

Mechanically toughened GaAs and other group III-V and group II-VI materials by hot-forging the GaAs and other materials to obtain the toughening or increase in mechanical strength. The material to be toughened is heated to its plastic temperature or higher but sufficiently below its melting point to maintain decomposition of the material to an acceptable level. A force or stress is then applied along a surface of the material which, acting in concert with the thermal energy (temperature) on the GaAs, is sufficient to nucleate and move dislocations along slip planes in the material to obtain slip or plastic deformation. The material is thereby being flattened due to the stress applied thereto, resulting in a fine, almost polycrystalline or textured (micron size grains) material. This slip process forms many dislocations throughout the GaAs and slightly rearranges most of the parts of the crystal. Therefore, if a crack must move through the material, there remains no one cleavage plane that extends from one end of the crystal to the other whereat the crack can continue to propagate. The crystallographic plane has been interrupted by all of the dislocations therein. It is this texturing of the material that increases the energy required to propagate a crack in the material and which renders the material tougher or mechanically stronger.

15 Claims, 1 Drawing Sheet

METHOD OF IMPROVING THE MECHANICAL PROPERTIES OF SEMICONDUCTOR MATERIALS

BACKGROUND OF THE INVENTION

1. Field of the Invention

This invention relates primarily to fabrication of group IIIA-VA semiconductor materials and also to zinc blende semiconductors, diamonds and the like and, more specifically, to improving the mechanical properties, primarily of group IIIA-VA semiconductor materials, but not limited thereto.

2. Background and Brief Description of the Prior Art

Group IIIA-VA compound semiconductor materials and particularly gallium arsenide (GaAs), gallium phosphide (GaP) and indium phosphide (InP) are becoming important optical materials for use in the infrared (IR) and microwave regions of the electromagnetic spectrum. These uses include windows, domes, lenses, etc. for use in electro-optical systems such as forward looking infrared (FLIR) systems, IR warning and target systems and seeker systems. In many of these applications, use of GaAs is very limited or the GaAs is not used at all because of its relatively poor mechanical properties.

Single crystal and large (>1 mm) polycrystalline GaAs and other single crystal and polycrystalline group IIIA-VA semiconductor compounds are generally brittle, possessing cleavage planes along which they can very easily crack apart. While the cubic zinc-blende crystallographic structure of GaAs results in many such cleavage planes, the predominant cleavage plane is the {110} family of planes because they require the least amount of stress to crack or cleave them apart. These cleavage planes represent a path along which a crack can propagate by a driving force of very low stress. Because all optical quality GaAs is produced as either single crystal or large polycrystalline material, the cleavage planes will traverse or nearly traverse the physical dimensions of whatever optical sample is fabricated. Due to the low stress levels required to separate them and the degree to which they extend through the sample, the cleavage planes seriously reduce the fracture strength of the GaAs optical components.

The low fracture strength of GaAs wafers for digital and microwave electronic devices results from the same problem of cleavage planes. The problem in optical quality GaAs as opposed to semiconductor quality GaAs is emphasized herein only because it is much more limiting to the potential uses of the material for that purpose.

In most crystallographic planes, the intrinsic bond strength of GaAs is very high. If these strengths could be maintained throughout the entire GaAs component, the fracture strength would be sufficiently great to permit the use of optical quality GaAs in such applications as high speed windows and domes on aircraft and missiles or any other application, optical or electrical, where high mechanical strength GaAs would be desired. This toughening process also has a significant effect on the yield of GaAs-based electronic devices, such as digital or microwave circuits, by reducing the number of GaAs wafers lost in the front-end fabrication due to cracking, thereby providing a significant economic advantage.

To date, there is no known literature relating to attempts to strengthen GaAs, primarily relating to its fracture strength.

SUMMARY OF THE INVENTION

In accordance with the present invention, GaAs and other group IIIA-VA semiconductor materials, group IIA-VIA semiconductor materials and possibly diamond can be provided with added mechanical strength, primarily against cleavage and cracking, by hot-forging of the material. The hot forging provides greatly improved mechanical strength of the material by as much as a factor of about two relative to the typical as-grown material which is currently the only type of material used in any optical or electrical application. As-grown material is either single crystal or large (cm. size) polycrystalline. The discussion hereinafter will primarily relate to GaAs. However, it should be understood that group IIIA-VA and group IIA-VIA compounds are equivalents thereto within the scope of this invention and are included herein.

Fabrication of hot-forged GaAs involves the application of a uniaxial stress on the material while the material is held at elevated temperatures as discussed hereinbelow. This is accomplished in an inert atmosphere within a closed system which results in negligible thermal decomposition of the material at the temperatures involved, such temperatures being in the range of from about 0.6 to about 0.7 of or about 200° to 400° C. below the melting point of the GaAs or other group IIIA-VA or group IIA-VIA semiconductor compound with reference to 0° C., the actual operating temperature depending upon the melting point of the material being strengthened and the temperature at which the material becomes plastic. The temperatures utilized are those where there is sufficient thermal energy in the crystalline material involved (i.e., the atoms are now in sufficient motion) such that, when a force is applied, the material does not respond elastically and return to its original shape (i.e., it deforms and becomes plastic or that the material behaves plastically or allows for certain degrees of plastic deformation). In general, with a single crystal, the preferred amount of deformation is the maximum deformation possible at the temperature being utilized, this being about 30 to 35% in the direction of application of the stress with a preferred range of from about 10% to the point where the dislocations interfere with each other and further deformation ceases, this being at about 30 to 35% at low plastic deformation temperatures. The amount of deformation can be increased with increase in operating temperature above the plastic temperature during application of the stress. In the case of polycrystalline materials, the deformation obtained at similar temperatures to those in the case of single crystal is about one half. The operating temperature will depend upon the exact nature of the polycrystalline material being used, such as the number of grains, the size of the grains, the orientation of the grains, etc. In other words, the minimum temperature at which the process herein can operate is that temperature wherein some significant structural relaxation can be obtained without melting, this temperature being referred to herein as the plastic temperature. It is preferred that the lowest possible temperature at which plastic deformation is obtained be used to minimize decomposition of the material, although higher temperatures can be used as long as decomposition is minimized and at an acceptable level.

The stress applied, ranging from 1 to 10 Kpsi, acting in concert with the thermal energy (temperature) on the GaAs, is sufficient to nucleate and move dislocations along slip planes in the material to obtain the slip or plastic deformation. The material is thereby being flattened due to the stress applied thereto, resulting in a fine, almost polycrystalline or textured (micron size grains) material. This slip process forms many dislocations throughout the GaAs and slightly rearranges most of the parts of the crystal. Therefore, if a crack must move through the material, there remains no one cleavage plane that extends from one end of the crystal to the other whereat the crack can continue to propagate. The crystallographic plane has been interrupted by all of the dislocations therein. It is this texturing of the material that increases the energy required to propagate a crack in the material and which renders the material tougher or mechanically stronger.

BRIEF DESCRIPTION OF THE DRAWING

The FIGURE shows a hot press and graphite molds for hot forging or toughening materials in accordance with the present invention.

DESCRIPTION OF THE PREFERRED EMBODIMENT

Figure 1:
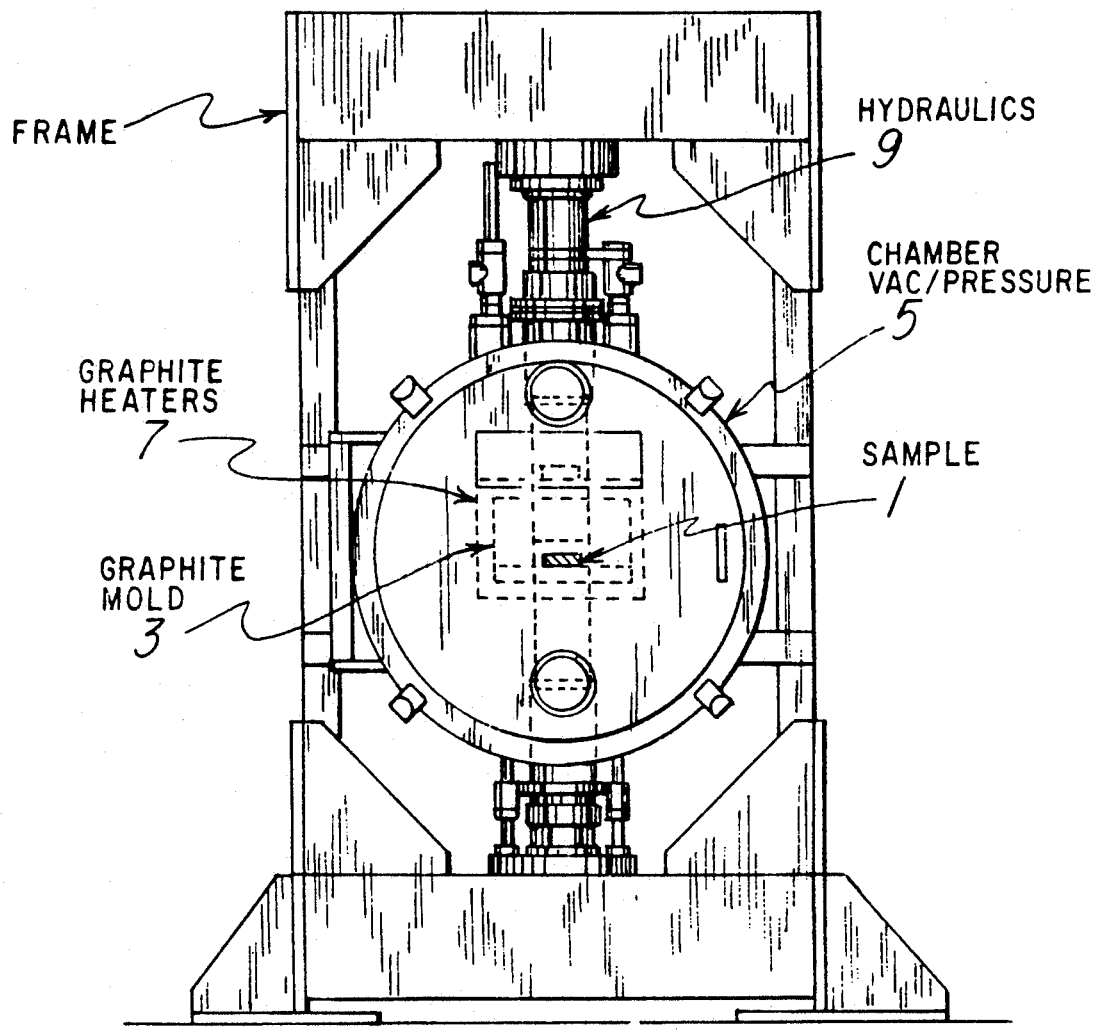

With reference to the FIGURE, a preferred process in accordance with the present invention will be described with reference to GaAs.

GaAs single or polycrystalline material with the desired optical and/or electrical properties is cut and ground to the desired dimensions with two opposed surfaces cut flat and parallel to each other. Both of these two surfaces are then ground with 30T ($Al_2O_3$ grit) grinding compound. This is done to achieve uniform nucleation of slip dislocations. This uniformity of dislocations in the material results in uniform optical, electrical and mechanical properties in the GaAs. The ground GaAs sample 1 is then placed inside a graphite mold 3 which in turn is placed inside a hot press or vacuum/pressure chamber 5 as diagrammed in the FIGURE. The press is evacuated and heated to approximately 500° C. by graphite heaters 7, at which time the press is backfilled with an inert gas, typically $N_2$. Heating then continues to 850° C. at which time the hydraulic press begins to apply force to the graphite mold via hydraulics 9 which, in turn, applies force on the GaAs sample 1. The force is applied to the GaAs at a stress rate of approximately 1000 pounds per minute until the final approximate stress is reached of 10,000 pounds per square inch (psi). The force is then completely removed and the sample is annealed at 850° C. for six hours and cooled back to romm temperature at 1° C. per minute. This process results in significantly tougher GaAs with useful optical and electrical properties. The process conditions described above are approximate and a wide range of temperatures, forces and surface treatments will produce similar results.

Table 1, set forth in the Appendix hereto, summarizes some of the results of the hot-forging experiments in accordance with the above described preferred embodiment.

Some important novel features of this invention include: mechanically toughened GaAs, hot-forged GaAs, hot-forging processing for GaAs, abraded surfaces of GaAs for homogeneous physical properties of hot-forged GaAs, toughened IR optical quality GaAs and toughened GaAs wafers for electronic devices.

The above described technique for mechanically toughening GaAs can be utilized for other optical materials, including, but not limited to GaP, InP and diamond. Toughening of these materials by hot-forging also extends the number and type of high speed window and dome applications that they can address. This technique of mechanically toughening optical and electronic materials can be applied to many group IIIA-VA and group IIA-VIA and elemental (Si, Ge) materials provided their crystal type permits plastic deformation via slip mechanism at temperatures and atmospheres that do not degrade the material. A significant increase in the strength of these materials via hot-forging is very valuable toward their ultimate application.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

TABLE 1

APPENDIX
COMPARISON OF GaAs AND NOT FORGED TOUGHENED GaAs

| Sample # | Crystal Type | Optical Transmission/Absorption Coefficient | | | | | | | Deformation % | Hardness kg/mm³ | Fracture Toughness MPa m½ | Stress Rate lbs/min | Strain Rate mm/min |
|---|---|---|---|---|---|---|---|---|---|---|---|---|---|
| | | Before % | 1.06 μm cm⁻¹ | % | After cm⁻¹ | Before % | 10.0 μm cm⁻¹ | % | After cm⁻¹ | | | | | |
| 7-82-87 #1 | Single | 6.71 | 1.09 | 25.6 | 0.63 | 55.44 | >.01 | 54.27 | 0.02 | 22 | 673 | 0.75 | 700 | 0.18 |
| 7-84-87 #61 | Single | | | | NO FORGING | | | | | 0 | 601 | 0.60 | 0 | 0 |
| A, B, E | Poly | | | | NO FORGING | | | | | 0 | 576 | 0.62 | 0 | 0 |
| #69 B | Poly | 13.28 | 0.85 | 19.72 | 0.77 | 55.13 | <.01 | 53.67 | 0.02 | 16 | 577 | 0.97 | 1400 | 0.17 |

I claim:
1. A method of improving the mechanical strength of a crystalline material, comprising the steps of:
 (a) providing a crystalline material having a crystal type permitting plastic deformation via slip mechanism at temperatures and atmospheres that do not materially degrade the material, wherein said crystalline material is selected from the group consisting of compounds of group IIIA and VA elements, compounds of group IIA and VIA elements, diamond, silicon and germanium;
 (b) heating said crystalline material to a temperature at which plastic deformation is obtainable;
 (c) applying a force to said heated crystalline material to cause deformation of said crystalline material of at least 10 percent to move dislocations in said crystalline material along slip planes in said crystalline material and form dislocations throughout said crystalline material whereby the energy required to propagate a crack in said crystalline material is increased; and (d) removing said force from said crystalline material.

2. A method as set forth in claim 1 wherein said crystalline material is selected from the group consisting of GaAs, GaP and InP.

3. A method as set forth in claim 2 wherein said crystalline material is heated to a temperature of from about 0.6 to about 0.7 of its melting temperature relative to 0° C.

4. A method as set forth in claim 3 wherein said deformation is the maximum deformation obtainable at the temperature to which said crystalline material is heated.

5. A method as set forth in claim 2 wherein said crystalline material is heated to a temperature of from about 200° to about 440° C. below the melting point thereof.

6. A method as set forth in claim 5 wherein said deformation is the maximum deformation obtainable at the temperature to which said crystalline material is heated.

7. A method as set forth in claim 6 wherein said force is applied along a single axis of said crystalline material, said crystalline material having a pair of opposing flat surfaces, said single axis being normal to the plane of each of said opposing flat surfaces.

8. A method as set forth in claim 2 wherein said deformation is the maximum deformation obtainable at the temperature to which said crystalline material is heated.

9. A method as set forth in claim 1 wherein said crystalline material is heated to a temperature of from about 0.6 to about 0.7 of its melting temperature relative to 0° C.

10. A method as set forth in claim 9 wherein said deformation is the maximum deformation obtainable at the temperature to which said crystalline material is heated.

11. A method as set forth in claim 1 wherein said crystalline material is heated to a temperature of from about 200° to about 440° C. below the melting point thereof.

12. A method as set forth in claim 11 wherein said deformation is the maximum deformation obtainable at the temperature to which said crystalline material is heated.

13. A method as set forth in claim 1 wherein said deformation is the maximum deformation obtainable at the temperature to which said crystalline material is heated.

14. A method as set forth in claim 1 wherein said force is from about 1 to about 10 Kpsi.

15. A method as set forth in claim 1 wherein said force is applied along a single axis of said crystalline material, said crystalline material having a pair of opposing flat surfaces, said single axis being normal to the plane of each of said opposing flat surfaces.

* * * * *